(12) United States Patent
Pyeon

(10) Patent No.: US 6,502,214 B1
(45) Date of Patent: Dec. 31, 2002

(54) MEMORY TEST CIRCUIT

(75) Inventor: Hong-Beom Pyeon, Choongcheongbuk-Do (KR)

(73) Assignee: Hyundai Micro Electronics Co., Ltd., Choongcheongbuk-Do (KR)

( * ) Notice: Subject to any disclaimer, the term of this patent is extended or adjusted under 35 U.S.C. 154(b) by 0 days.

(21) Appl. No.: 09/386,158

(22) Filed: Aug. 31, 1999

(30) Foreign Application Priority Data

Nov. 11, 1998 (KR) ............................................ 98-48186

(51) Int. Cl.$^7$ ............................................... G11C 29/00
(52) U.S. Cl. ......................... 714/718; 365/200; 365/201
(58) Field of Search .......................... 714/718; 365/201, 365/222, 200

(56) References Cited

U.S. PATENT DOCUMENTS 5,629,898 A * 5/1997 Idei et al. .................... 365/222
5,691,952 A * 11/1997 Sasaki et al. ................ 365/200
5,892,721 A * 4/1999 Kim ........................... 365/201

OTHER PUBLICATIONS

Takashi Ohsawa et al. "A 60–ns 4–Mbit CMOS DRAM With Built–In–Self–Test Function" IEEE Journal of Solid–State Circuits, vol. SC–22, No. 5, Oct. 1987, pp. 663–667.

* cited by examiner

*Primary Examiner*—Phung M. Chung
(74) *Attorney, Agent, or Firm*—Fleshner & Kim, LLP

(57) ABSTRACT

A memory test circuit in a test mode divides a plurality of mats forming a memory and coupled with identical global input/output lines into even and odd-numbered mats and simultaneously activates the even or odd-numbered mats. The memory test circuit sequentially amplifies the activated even or odd-numbered mats, and simultaneously compares the amplified mats in a latch unit, which decreases the memory test time. The memory test circuit can further include a mat controlling unit for dividing a plurality of mats into even and odd-numbered units and simultaneously controlling the even or odd-numbered mats, a mat switch controlling unit for controlling a plurality of mat switches to be sequentially operated, a main amp controlling unit for controlling a plurality of main amps to be sequentially operated, and a latch unit for latching data amplified by the plurality of main amps to be simultaneously outputted.

19 Claims, 7 Drawing Sheets

MEMORY TEST CIRCUIT

BACKGROUND OF THE INVENTION

1. Field of the Invention

The present invention relates to a memory test circuit for testing a semiconductor memory device, and more particularly to a memory test circuit capable of reducing memory test time.

2. Background of the Related Art

Generally, a memory unit includes a 256K standard cell array, a wordline driving circuit for driving wordlines, and eight mats, each of which includes a sense amplifier. Eight memory units constitutes a 16M DRAM. The number of main amps used in a 16M DRAM ranges between 16 and 64. By way of example, a 16M DRAM that uses 32 main amps will be discussed.

FIG. 1 is a block diagram of a related art memory test circuit. As shown therein, the memory test circuit includes first to eighth mats MAT1–MAT8, each consisting of a 256K standard cell array, a wordline driving circuit for driving wordlines, and a sense amp. Local input/output lines 1 and global input/output lines 2 transfer information to the first to eighth mats MAT1–MAT8, or transfer out information stored in the mats MAT1–MAT8. First to ninth mat switches MSW1–MSW9 selectively connect or disconnect the local input/output lines 1 with the global input/output lines 2, and first to fourth main amps MA1–MA4 amplify data in the global input/output lines 2. Finally, a comparing unit COMP compares outputs from the first to fourth main amps MA1–MA4.

In a normal operation, that is when simply performing a reading operation, data written in a memory cell of a memory cell array of a selected mat are outputted to the corresponding local input/output line 1 through a corresponding bit line. Then, the data in the local input/output line 1 are outputted to the global input/output line 2 through the corresponding mat switch MSW1–MSW9. The main amp MA1–MA4 amplifies the inputted data and outputs it to an output buffer (not shown).

In a test mode operation, the test time is reduced by decreasing the number of addresses that are generated. Thus, all of the first to fourth main amps MA1–MA4 are operated and outputs from the first to fourth main amps are compressed by using a logic device that operates the 16M DRAM as 1M DRAM. In other words, in the test mode operation, the data loaded in the global input/output line 2 are not distinguished by the addresses, as in the normal operation, and are inputted to the main amps MA1–MA4 and all amplified. Accordingly, the data amplified by the main amps MA1–MA4 are connected to the comparing unit COMP, which supplies a single data to an output buffer (not shown).

However, the related art memory test circuit has various disadvantages. For example, due to the high integration in the related art memory test circuit, a satisfactory throughput of the test process can be achieved only when more address comparisons are carried out. Hence, additional main amps are necessary for the test mode in the memory test circuit. This increases the chip size and reduces the process speed.

Further, the comparison of numerous addresses leads to a decrease of data fault coverage, which causes a problem that failures found by the memory test circuit cannot be repaired, or a problem that an additional test using a full address is then required to locate the failure.

SUMMARY OF THE INVENTION

An object of the present -invention is to provide a memory test circuit that substantially obviates one or more of the problems caused by the disadvantages of the related art.

Another object of the present invention is to reduce a test time of a memory array.

Another object of the present invention is to provide a memory test circuit that reduces a test time of a highly integrated memory without providing an additional main amp.

Another object of the present invention is to provide a memory test circuit that divides a memory array into a plurality of even and odd numbered mats and concurrently tests the even or odd numbered mats to reduce test time of the memory array.

To achieve at least the above objects in a whole or in parts, there is provided a memory test circuit having a mat controlling unit for dividing a plurality of mats into even and odd-numbered units and simultaneously controlling the even or odd-numbered mats, a mat switch controlling unit for controlling a plurality of mat switches to be equentially operated, a main amp controlling unit for controlling a plurality of main amps to be sequentially operated and a latch unit for latching data amplified by the plurality of main amps to be simultaneously outputted. By dividing the mats into even and odd-numbered units, the circuit can simultaneously test the even or odd-numbered mats when testing a highly integrated semiconductor memory device.

To further achieve the above objects in a whole or in parts, there is provided a memory test circuit according to the present invention that include a plurality of mats coupled to local input/output lines, a plurality of mat switches that selectively connect or disconnect corresponding ones of the local input/output lines with global input/output lines, wherein the local input/output lines and the global input/output lines transfer information to the plurality of mats or transfer information stored in the mats, a plurality of main amps that amplify data coupled to the global input/output lines, a mat switch controlling circuit that controls the plurality of mat switches, a latch circuit that latches data amplified by the plurality of main amps to be substantially simultaneously outputted, a mat controlling circuit that controls the plurality of mats to be respectively activated according to each mode of a plurality of modes, and a main amp controlling circuit that controls the plurality of main amps to be sequentially operated.

To further achieve the above objects in a whole or in parts, there is provided a memory test circuit having a plurality of cell array mats according to the present invention that includes a mat controller coupled to each of the plurality of mats and responsive to a first address signal and a test mode enable signal, wherein. the mat controller divides the plurality of mats into even and odd-numbered mats, simultaneously enables one of the even and odd-numbered mats, and sequentially couples each of the plurality of mats with a plurality of input/output lines.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
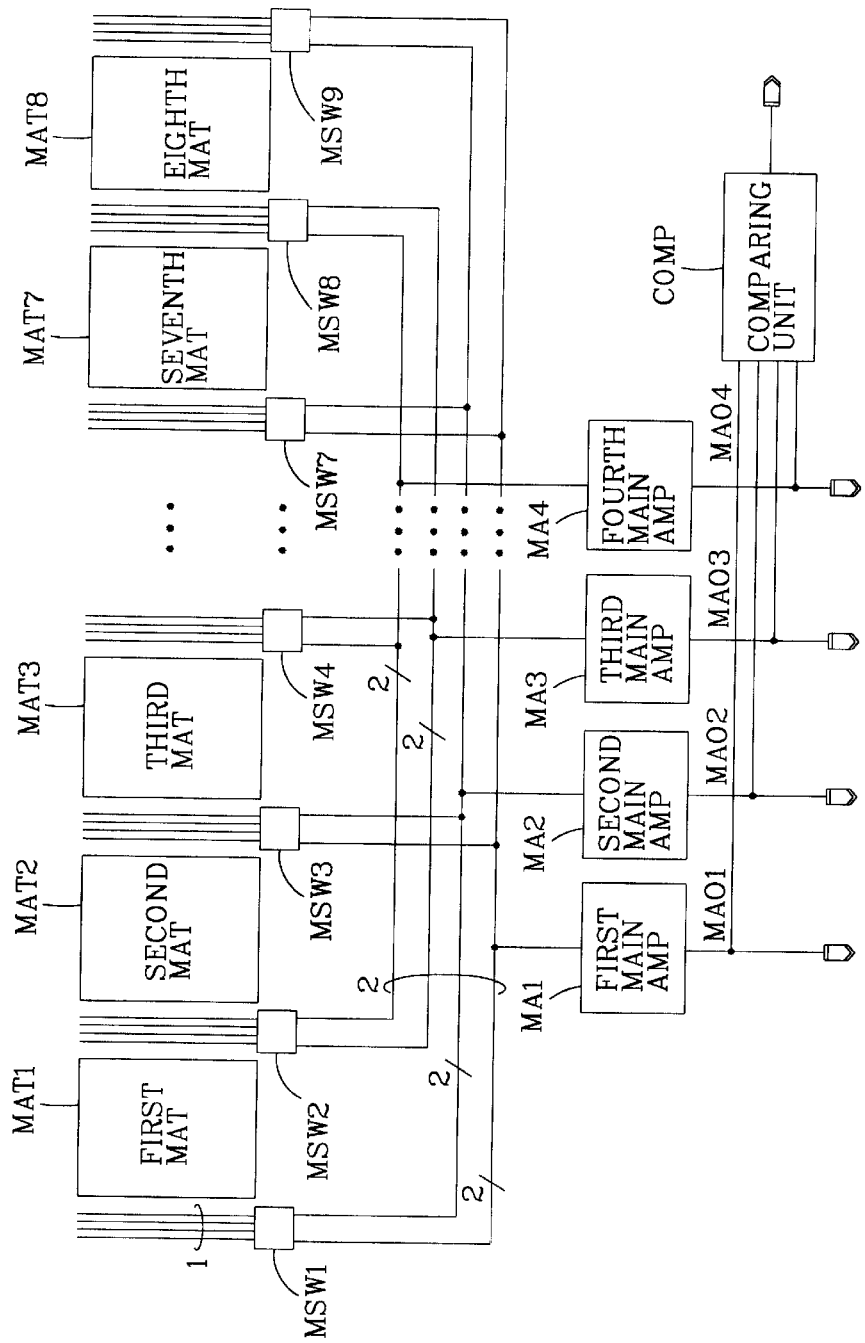
FIG. 1 is a block diagram that shows one embodiment of a related art memory test circuit.
Figure 2:
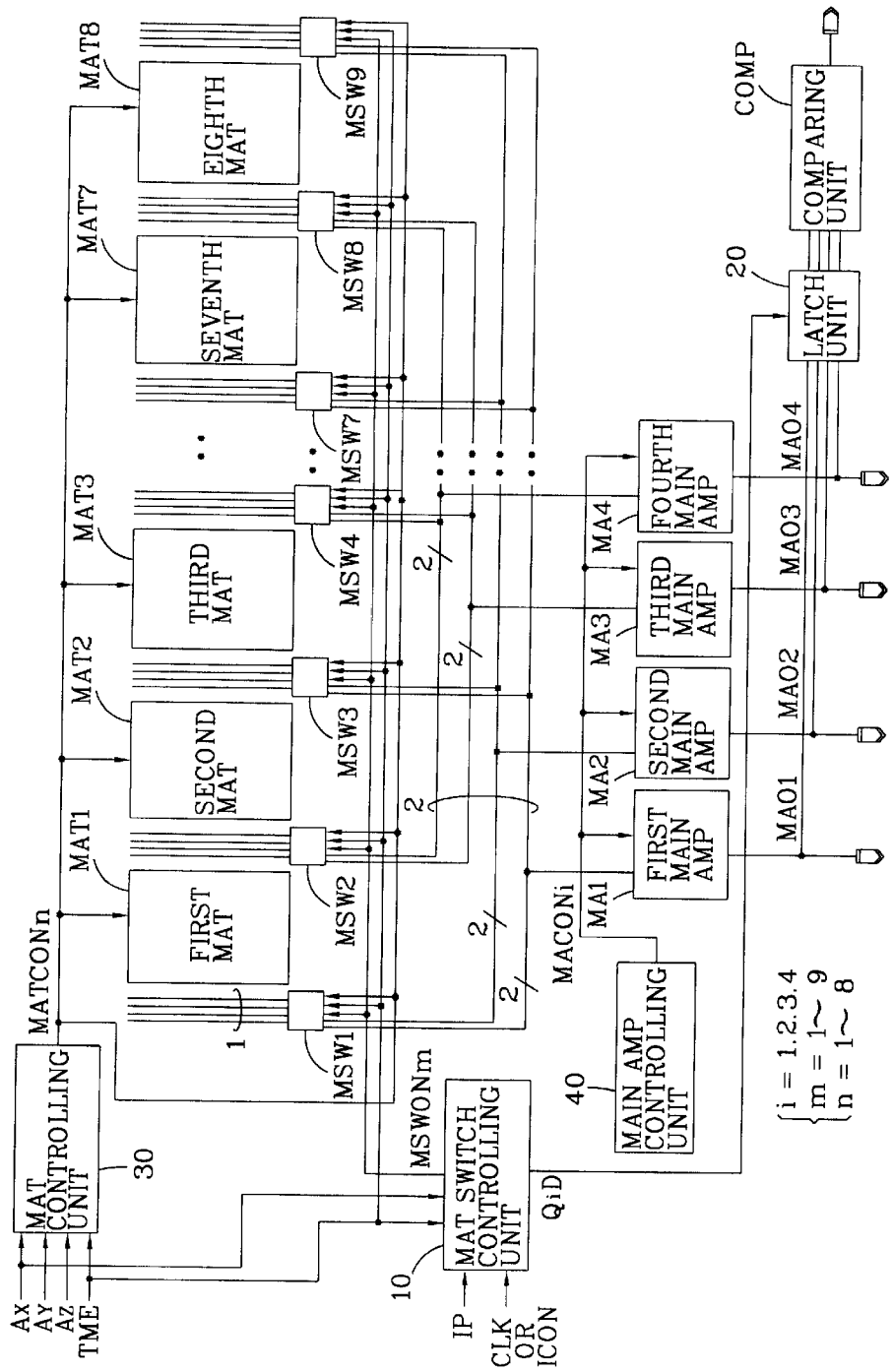
FIG. 2 is a block diagram that shows a preferred embodiment of a memory test circuit according to the present invention.

Reference will now be made in detail to the preferred embodiments of the present invention, examples of which are illustrated in the accompanying drawings. FIG. 2 illustrates a memory test circuit according to one preferred embodiment of the present invention. As shown therein, the memory test circuit preferably includes first to eighth mats MAT1–MAT8, each preferably including the 256K standard cell array, the wordline driving circuit for driving wordlines, and the sense amp. The local input/output lines 1 and the global input/output lines 2 transfer information to the first to eighth mats MAT1–MAT8 or transfer information stored in the mats MAT1–MAT8. The first to ninth mat switches MSW1–MSW9 selectively connect or disconnect the local input/output lines 1 with the global input/output lines 2, and the first to fourth main amps MA1–MA4 amplify data in the global input/output lines 2. The comparing unit COMP compares outputs from the first to fourth main amps MA1–MA4.

The preferred embodiment of the memory test circuit further preferably includes a mat switch controlling unit 10, which controls the first to ninth mat switches MSW1–MSW9, and a latch unit 20 that latches data amplified by the first to fourth main amps MA1–MA4 to be simultaneously outputted. A mat controlling unit 30 selects and activates a specific mat in the normal mode, and divides the mats MAT1–MAT8, which are connected to the global input/output lines 2, preferably into even-numbered mats and odd-numbered mats. The mat controlling unit 30 also simultaneously activates only the even-numbered mats or the odd-numbered mats in the test mode, and a main amp controlling unit 40 controls the first to fourth main amps MA1–MA4 to be sequentially operated.

Figure 3:
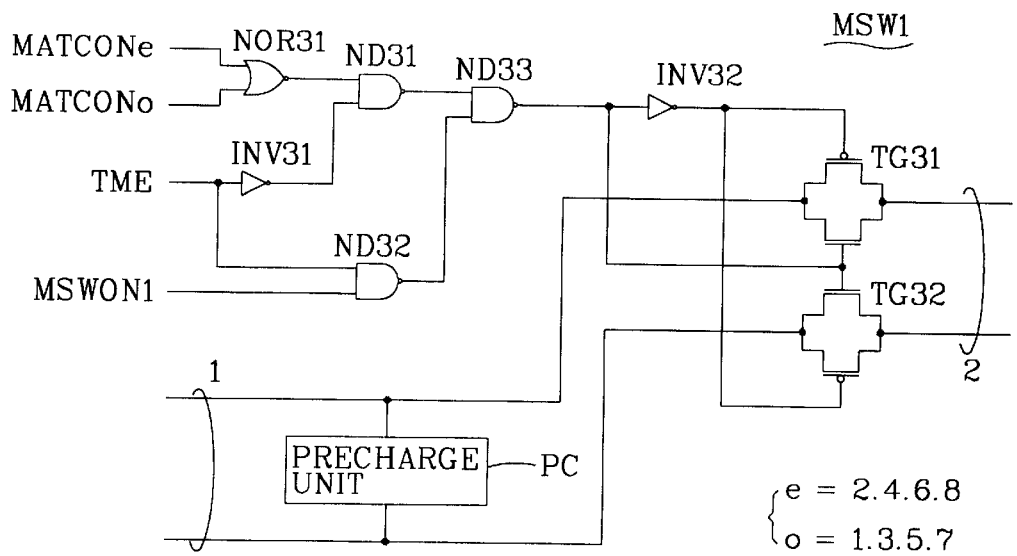
FIG. 3 is a circuit diagram that shows a preferred embodiment of a mat switch in the memory test circuit of FIG. 2.

As shown in FIG. 3, a preferred embodiment of the first mat switch MSW1 preferably includes a NOR gate NOR31 for logically combining a first mat control signal MATCON1 with an eighth mat control signal MATCON8, a first inverter INV31 for inverting a test mode enable signal TME, and a first NAND gate ND31 for logically combining an output from the NOR gate NOR31 with an output from the first inverter INV31. A second NAND gate ND32 logically combines the test mode enable signal TME with a first mat switch control signal MSWON1, and a third NAND gate ND33 logically combines outputs from the first and second NAND gates ND31, ND32.

A second inverter INV32 inverts an output from the third NAND gate ND33, while a precharge unit PC precharges selected local input/output lines 1. Additionally, first and second transmission gates TG31, TG32, which are respectively controlled by an output signal from the third NAND gate ND33 and an inverted signal thereof, selectively connect or disconnect the local input/output lines 1, which have been precharged by the precharge unit PC, with the global input/output lines 2. Each of the other mat switches MSW2–MSW9 is preferably configured like the first mat switch MSW1.

Figure 4:
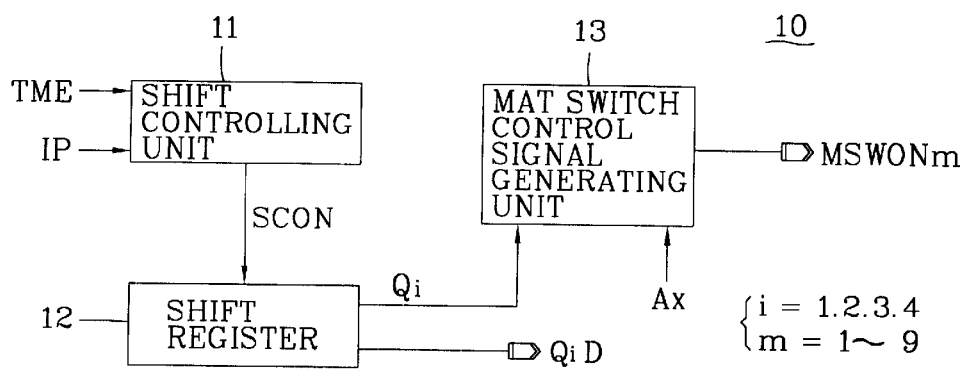
FIG. 4 is a block diagram that shows a preferred embodiment of a mat switch controlling unit in the memory test circuit of FIG. 2.

As shown in FIG. 4, a preferred embodiment of the mat switch controlling unit 10 preferably includes a shift controlling unit 11 for receiving both an internal pulse IP and the test mode enable signal TME and outputting a shift control signal SCON. Next, a shift register 12 receives the shift control signal SCON from the shift controlling unit 11 and shifts it. A mat switch control signal generating unit 13 then outputs first to ninth mat switch control signals MSWON1–MSWON9 by preferably combining first to fourth outputs Q1–Q4 from the shift register 12 with a least significant bit Ax among mat selection addresses.

Figure 5:
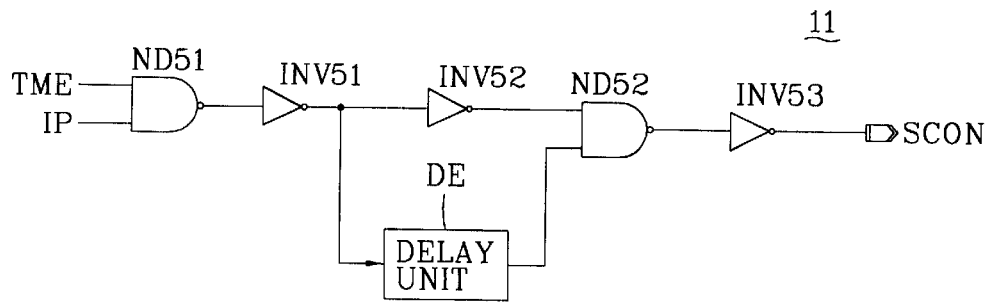
FIG. 5 is a circuit diagram that shows a preferred embodiment of a shift controlling unit in the mat switch controlling unit of FIG. 4.

FIG. 5 illustrates a preferred embodiment of the shift controlling unit 11 in the mat switch controlling unit 10. As shown therein, the shift controlling unit 11 includes a first NAND gate ND51 for logically combining the test mode enable signal TME with the internal pulse IP, and first and second inverters INV51, INV52 for sequentially inverting an output signal from the first NAND gate ND51. A delay unit DE delays an output signal from the first inverter INV51 for a predetermined time, and a second NAND gate ND52 logically combines an output signal from the delay unit DE with an output signal from the second inverter INV52. Finally, a third inverter INV53 outputs the shift control signal SCON by inverting an output signal from the second NAND gate ND52.

Figure 6:
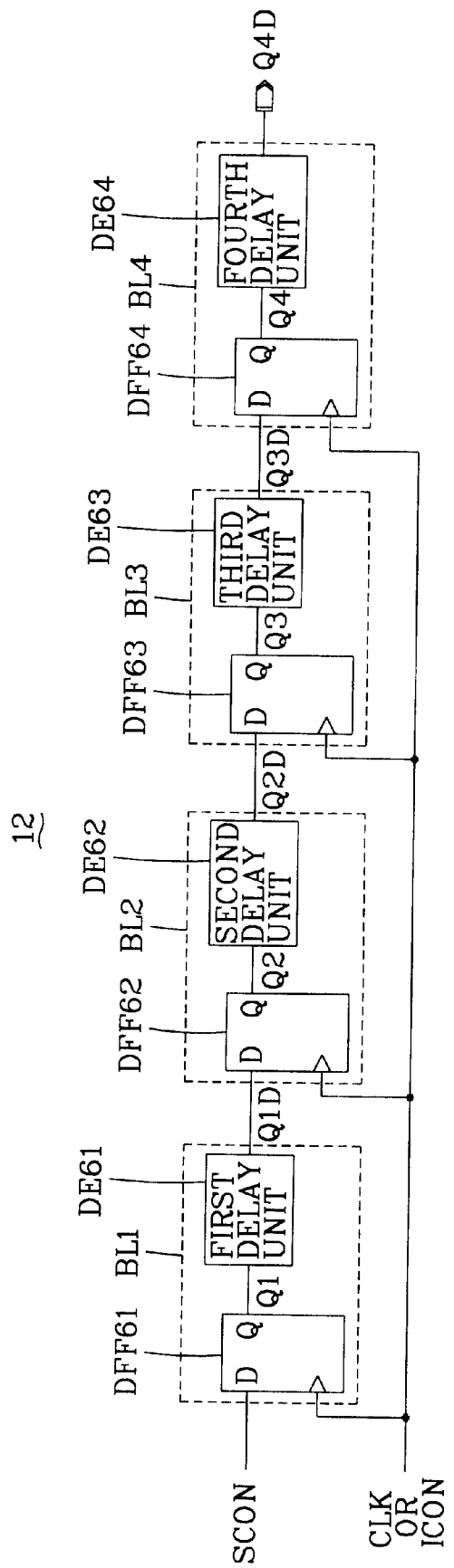
FIG. 6 is a circuit diagram that shows a preferred embodiment of a shift register in the mat switch controlling unit of FIG. 4.

FIG. 6 illustrates a preferred embodiment of the shift register 12 in the mat switch controlling unit 10. The shift register 12 includes first to fourth blocks BL1–BL4, which are serially connected. Each block BL1–BL4 includes a flip-flop DFF61–DFF64 synchronized with a clock signal CLK or an internal control signal ICON, and a delay unit DE61–DE64 for delaying a data output from each respective flip-flop DFF61–DFF64. A data output from each delay unit DE61–DE64 is inputted as data to the input terminal D of the following flip-flop, except that flip-flop DFF61 of the first block BL1 receives the shift control signal SCON as an input signal. The clock signal CLK or the internal control signal ICON is inputted to a clock input terminal of each flip-flop DFF61–DFF64.

Figure 7:
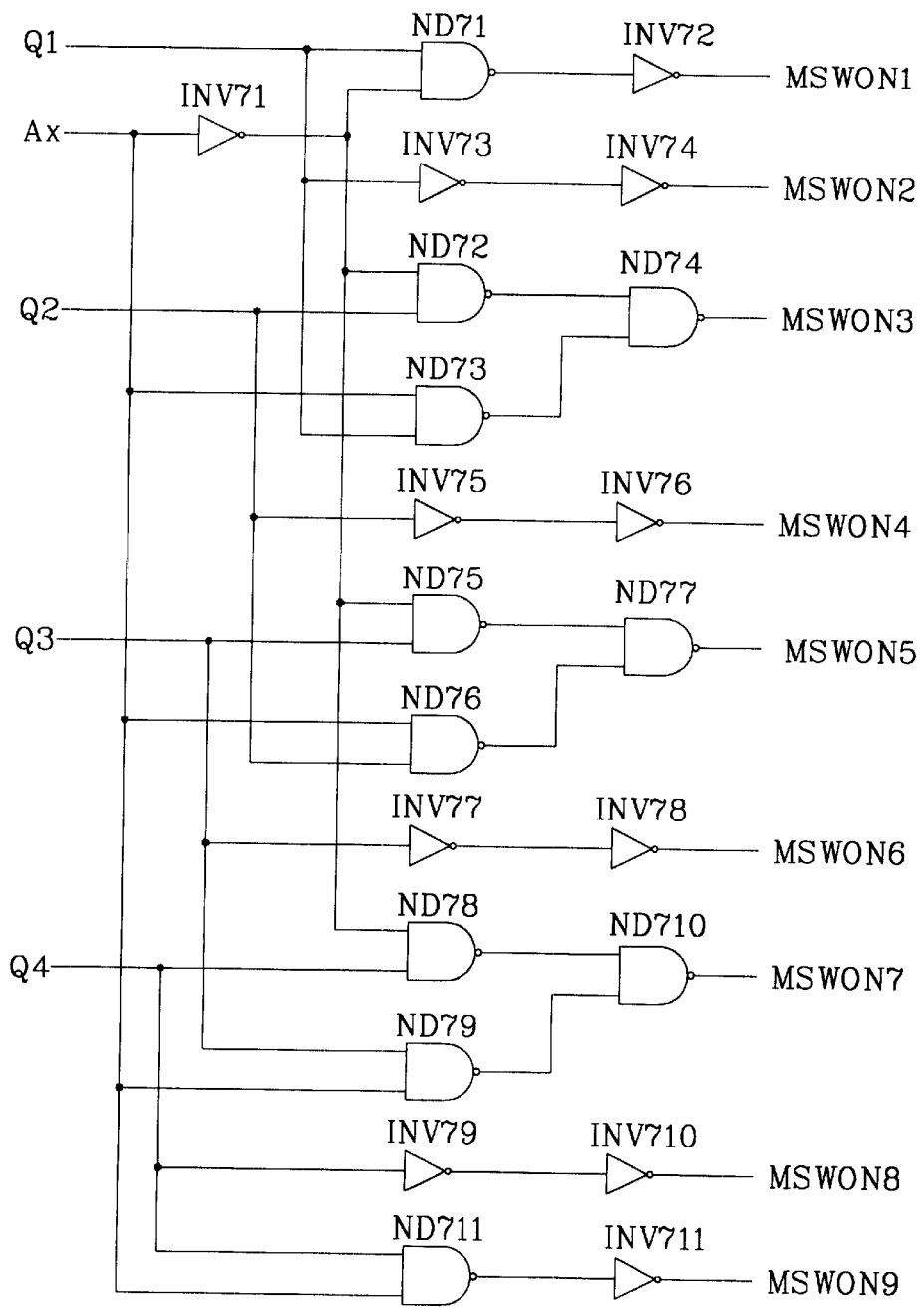
FIG. 7 is a circuit diagram that shows a preferred embodiment of a switch controlling unit in the mat switch controlling unit of FIG. 4.

As shown in FIG. 7, a preferred embodiment of the mat switch control signal generating unit 13 includes a first inverter INV71 for inverting the least significant bit Ax, for example, among the mat selection addresses, and a first NAND gate ND71 for logically combining the data output Q1 from the first flip-flop DFF61 of the shift register 12 with an output signal from the first inverter INV71. A second inverter INV72 outputs a first mat switch control signal MSWON1 by inverting an output signal from the first NAND gate ND71, and third and fourth inverters INV73, INV74 sequentially invert the data output Q1 from the first flip-flop DFF61 of the shift register 12 to output a second mat switch control signal MSWON2.

A second NAND gate ND72 logically combines the output signal from the first inverter INV71 with the data output Q2 from the second flip-flop DFF62 of the shift register 12, and a third NAND gate ND73 logically combines the least significant bit Ax, for example, of the mat selection addresses with the data output Q1 from the first flip-flop DFF61 of the shift register 12. A fourth NAND gate ND74 outputs a third mat switch control signal MSWON3 by logically combining output signals from the second and third NAND gates ND72, ND73. Fifth and sixth inverters INV75, INV76 sequentially invert the data output Q2 from the second flip-flop DFF62 of the shift register 12 to output a fourth mat switch control signal MSWON4.

A fifth NAND gate ND75 logically combines the output signal from the first inverter INV71 with the data output Q3 from the third flip-flop DFF63 of the shift register 12, and a sixth NAND gate ND76 logically combines the least significant bit Ax, for example, of the mat selection addresses with the data output Q2 from the second flip-flop DFF62 of the shift register 12. A seventh NAND gate ND77 logically combines the output signals from the fifth and sixth NAND gates ND75, ND76, and outputs a fifth mat switch control signal MSWON5. Seventh and eighth inverters INV77, INV78 sequentially invert the data output Q3 from the third flip-flop DFF63 of the shift register 12, thereby generating a sixth mat switch control signal MSWON6.

An eighth NAND gate ND78 logically combines the output signal from the first inverter INV71 with the data output Q4 from the fourth flip-flop DFF64 of the shift register 12, and a ninth NAND gate ND79 logically combines the data output Q3 from the third flip-flop DFF63 of the shift register 12 with the least significant bit Ax, for example, of the mat selection addresses. A tenth NAND gate ND710 logically combines output signals from the eighth and ninth NAND gates ND78, ND79 and outputs a seventh mat switch control signal MSWON7. Ninth and tenth inverters INV79, INV710 sequentially invert the data output Q4 from the fourth flip-flop DFF64 and output an eighth mat switch control signal MSWON8.

An eleventh NAND gate ND711 logically combines the least significant bit Ax, for example, of the mat selection addresses with the data output Q4 from the fourth flip-flop DFF74 of the shift register 12, and an eleventh inverter INV711 inverts an output signal from the eleventh NAND gate ND711 to generate a ninth mat switch control signal MSWON9.

Figure 8:
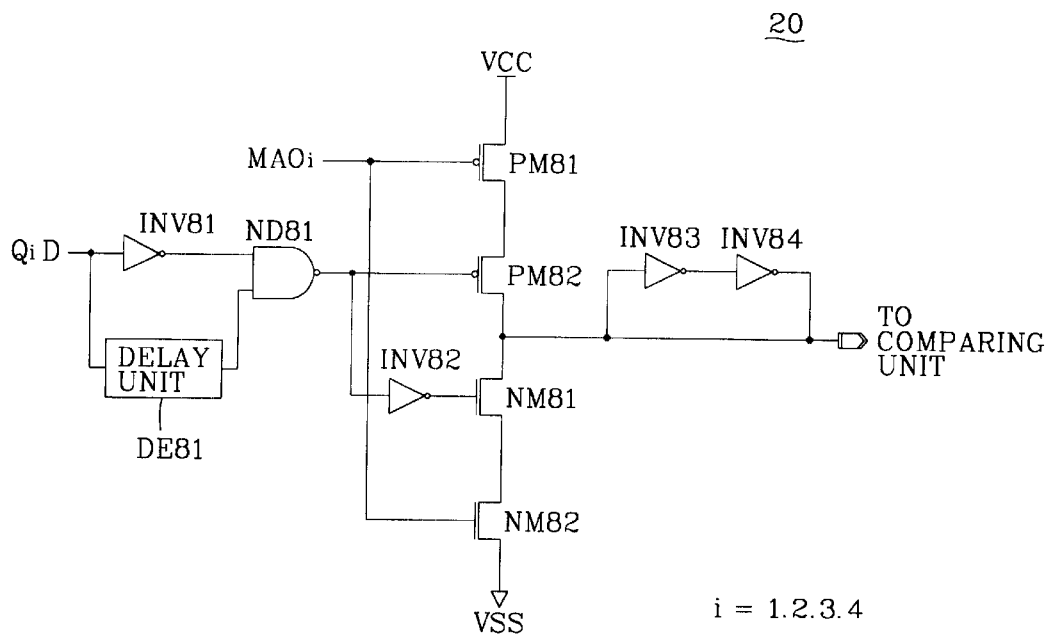
FIG. 8 is a circuit diagram that shows a preferred embodiment of a latch unit in the memory test circuit of FIG. 2.

As shown in FIG. 8, a preferred embodiment of the latch unit 20 includes a first delay unit DE81, which delays output signals from the first to fourth delay units DE61–DE64 of the shift register 12. A first inverter INV81 inverts the output signals from the first to fourth delay units DE61–DE64 of the shift register 12, and a first NAND gate ND81 logically combines signals supplied from the first inverter INV81 with the output of the first delay unit DE81. A second inverter INV82 inverts an output signal from the first NAND gate ND81.

Additionally, first PMOS and second NMOS transistors PM81, NM82 are provided, and each have a gate coupled to receive outputs from the first to fourth main amps MA1–MA4, respectively. Second PMOS and first NMOS transistors PM82, NM81 are also provided, and each have gates coupled to receive the output signal from the first NAND gate ND81 and an inverted signal thereof, respectively. Third and fourth inverters INV83, INV84 sequentially invert and latch an output signal from a common drain of the second PMOS transistor PM82 and the first NMOS transistor NM81. Further, the first and second PMOS and NMOS transistors PM81, PM82, NM81, NM82 are serially connected between an external source voltage VCC and a ground source voltage VSS.

Figure 9:
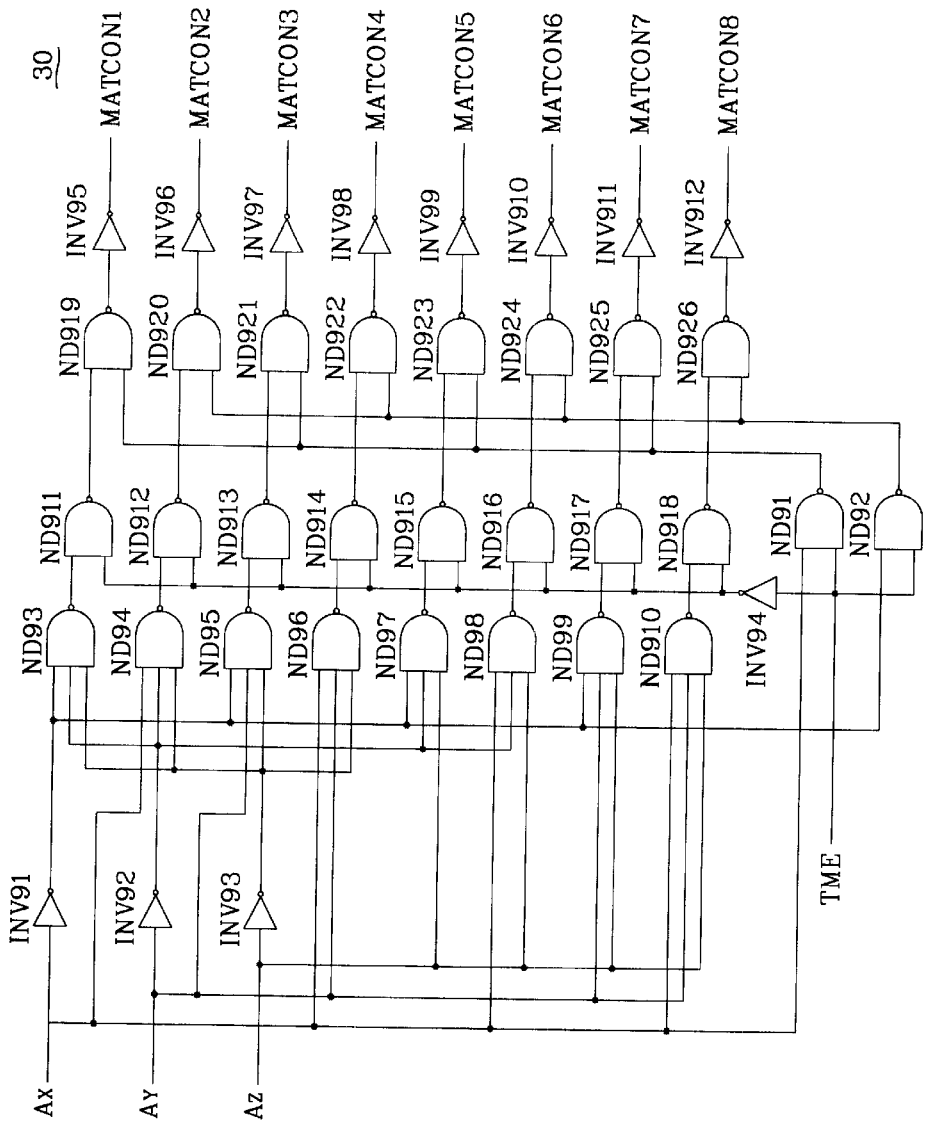
FIG. 9 is a circuit diagram that shows a preferred embodiment of a mat controlling unit in the memory test circuit of FIG. 2.

As shown in FIG. 9, a preferred embodiment of the mat controlling unit 30 includes of first to third inverters INV91–INV93 which invert first to third address signals Ax, Ay, Az, respectively. A first NAND gate ND91 logically combines the first address signal Ax with the test mode enable signal TME, and a fourth inverter INV94 inverts the test mode enable signal TME. A second NAND gate ND92 logically combines an output signal from the first inverter INV91 with the test mode enable signal TME, and a third NAND gate ND93 logically combines output signals from the first to third inverters INV91–INV93.

Next, a fourth NAND gate ND94 logically combines the output signals from the second and third inverters INV92, INV93 and the first address signal Ax, a fifth NAND gate ND95 logically combines the output signals from the first and third inverters INV91, INV93 and the second address signal Ay, and a sixth NAND gate ND96 logically combines the output from the third inverter INV93 and the first and second address signals Ax, Ay. A seventh NAND gate ND97 logically combines the outputs from the first and second inverters INV91, INV92 and the third address signal Az, an eighth NAND gate ND98 logically combines the first and third address signals Ax, Az and the output signal supplied from the second inverter INV92, and a ninth NAND gate ND99 logically combines the second and third address signals Ay, Az and the output signal from the first inverter INV91. Also, a tenth NAND gate ND910 logically combines the first, second, and third address signals Ax, Ay, Az.

Eleventh to eighteenth NAND gates ND911–ND918 logically combine output signals from each of the third to tenth NAND gates ND93–ND9 10, which are respectively received by first input terminals of the eleventh to eighteenth NAND gates ND911–ND918, with an output signal from the fourth inverter INV94, which is received by second input terminals of the eleventh to eighteenth NAND gates ND 911–ND 918, respectively. Nineteenth, twenty-first, twenty-third, and twenty-fifth NAND gates ND919, ND921, ND923, ND925 logically combine output signals from the eleventh, thirteenth, fifteenth, and seventeenth NAND gates ND911, ND913, ND915, ND917, respectively, with an output signal from the first NAND gate ND91. Twentieth, twenty-second, twenty-fourth, and twenty-sixth NAND gates ND920, ND922, ND924, ND926 logically combine output signals from the twelfth, fourteenth, sixteenth, and eighteenth NAND gates ND912, ND914, ND916, ND918, respectively, with an output signal from the second NAND gate ND92. Finally, fifth to twelfth inverters INV95–INV912 invert output signals from the nineteenth to twenty-sixth NAND gates ND919–ND926, respectively, and output first to eighth mat control signals MATCON1–MATCON8, respectively.

Operations of the preferred embodiment of memory test circuit will now be described. In the memory test circuit according to the preferred embodiment of the present invention, when only a reading operation is performed in the normal operation, if the first mat MAT1 is selected from among the mats which hold one of the global input/output lines 2 in common, data is loaded in a corresponding bit line and the loaded data is amplified by the sense amp. Next, the data which has been amplified by the sense amp is transmitted to the corresponding local input/output line 1. The local input/output line 1 is coupled to the global input/output line 2 by the selected mat switches MSW1, MSW2, which are pre-selected by the first address signal Ax. Thus, the data is transmitted to the first to fourth main amps MA1–MA4, which amplify and supply the data to an output buffer (not shown) through a data line.

Since the data line that is the output line of the first to fourth main amps MA1–MA4 is generally used in common, it is difficult to simultaneously transmit more than a single set of data at a time. Accordingly, only one of the main amps MA1–MA4 is selected, and the selected main amp amplifies data selected from among the four pairs of data. The amplified data is then transmitted to the output buffer (not shown) through the data line.

On the other hand, when only writing data in the normal operation, the operation is the reverse of the reading operation in the normal condition. That is, data inputted to the input buffer is transmitted to a selected mat through the global and local input/output lines 2, 1.

Next, the test mode will be described. When reading data in the test mode operation, the mat controlling unit 30 divides the mats MAT1–MAT8 into even and odd-numbered mats, whereby the even and odd-numbered mats are simultaneously enabled. This operation is preferably controlled by the first address signal Ax that corresponds to the least significant bit.

Unlike in the normal operation, the first to ninth mat switches MSW1–MSW9 are not pre-selected in the test mode. In accordance with the control of the mat switch controlling unit 10, the simultaneously operating first to fourth main amps MA1–MA4 may sequentially sense the sixteen pairs of data loaded in the global input/output lines. In other words, the four sets of data are simultaneously amplified in the corresponding first to fourth main amps MA1–MA4. In order to prevent data collision due to simultaneously enabled mats, the mat switch controlling unit 10 controls the first to ninth mat switches MSW1–MSW9, thereby sequentially transmitting the data to the first to fourth main amps MA1–MA4.

For instance, when enabling the odd-numbered mats, four sets of data from the first mat MAT1 are amplified by the first to fourth main amps MA1–MA4, then latched in the latch unit 20, compared to each other in the comparing unit COMP, and outputted to the output buffer (not shown). Next, four sets of data from the third mat MAT3 are amplified by the first to fourth main amps MA1–MA4, then latched in the latch unit 20, compared to each other in the comparing unit COMP, and outputted to the output buffer (not shown). Such operation, which combines parallel and serial data transmission modes, is sequentially applied to the following odd-numbered mats.

Further, when writing data in the test mode operations, the data inputted to the input buffer is written in the odd or even-numbered mats that have been sequentially activated through the global input/output lines 2, the local input/output lines 1, and the bit lines in accordance with the enabling order of the mat switches. It should be noted that identical data is respectively loaded in the four global input/output lines regardless of the address signals. At this time, the mats are divided into the even and odd-numbered mats and the divided mats are simultaneously activated in the writing operation of the test mode.

As described above, the memory test circuit of the present invention enables the mats which are divided into the even and odd-numbered units to perform the reading and writing operations in the test mode operation by using the latch unit, the mat switch controlling unit, and the mat controlling unit. This has the advantages of reducing the test time in the highly-integrated memory-test, as well as reducing the chip size since no additional components are provided in the main amp.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A memory test circuit, comprising:

a plurality of mats coupled to local input/output lines;

a plurality of mat switches that selectively connect or disconnect corresponding ones of the local input/output lines with global input/output lines, wherein the local input/output lines and the global input/output lines transfer information to the plurality of mats or transfer information stored in the mats;

a plurality of main amps that amplify data coupled to the global input/output lines;

a mat switch controlling circuit that controls the plurality of mat switches;

a latch circuit that latches data amplified by the plurality of main amps to be substantially simultaneously outputted;

a mat controlling circuit that controls the plurality of mats to be respectively activated according to each mode of a plurality of modes; and a main amp controlling circuit that controls the plurality of main amps to be sequentially operated.

2. The circuit of claim 1, wherein said mat controlling circuit activates a selected mat in a normal mode, and wherein in a test mode said mat controlling circuit divides the mats coupled with the global input/output lines into even and odd-numbered mats and substantially simultaneously activates the even or odd-numbered mats.

3. The circuit of claim 1, wherein a first mat switch comprises:

a NOR gate for logically combining control signals for controlling even-numbered mats and control signals for controlling odd-numbered mats;

a first inverter for inverting a test mode enable signal;

a first NAND gate for logically combining an output from said NOR gate and an output from said first inverter;

a second NAND gate for logically combining the test mode enable signal and a first mat switch control signal;

a third NAND gate for logically combining outputs from said first and second NAND gates;

a second inverter for inverting an output from said third NAND gate;

a precharge circuit for precharging local input/output lines in which data from specific mats are loaded; and first and second transmission gates respectively controlled by the output from said third NAND gate and an inverted signal thereof, and for selectively connecting or disconnecting the precharged local input/output lines with the global input/output lines.

4. The circuit of claim 1, wherein said mat switch controlling circuit comprises:
- a shift controlling circuit for receiving an internal pulse and a test mode enable signal and outputting a shift control signal;
- a shift register for receiving and shifting the shift control signal from said shift controlling circuit; and
- a mat switch control signal generating circuit for outputting a plurality of mat switch control signals by combining a plurality of data outputs from said shift register and a prescribed bit among mat selection addresses.

5. The circuit of claim 4, wherein said shift controlling circuit comprises:
- a first NAND gate for logically combining the test mode enable signal and the internal pulse;
- first and second inverters for sequentially inverting an output signal from said first NAND gate;
- a delay circuit for delaying an output signal from said first inverter;
- a second NAND gate for logically combining output signals respectively from said delay circuit and said second inverter; and
- a third inverter for outputting the shift control signal by inverting an output signal from said second NAND gate.

6. The circuit of claim 4, wherein said shift register comprises:
- a plurality of serially coupled circuits, each comprising a flip-flop synchronized with one of a clock signal and an internal control signal, and a delay circuit for delaying data output from the flip-flop in each circuit, wherein a clock terminal of each of the flip-flops receives one of the clock signal and the internal control signal, and a data input terminal of said each of the flip-flops receives data output from the delay circuit of each preceding circuit, respectively, wherein a data terminal of the flip-flop of the first circuit of the plurality of serially coupled circuits receives the shift control signal.

7. The circuit of claim 4, wherein the prescribed bit is a least significant bit among the mat selection addresses, and wherein said mat switch control signal generating circuit comprises:
- a first inverter for inverting a least significant bit of the mat selection addresses;
- a first NAND gate for logically combining data output from a first flip-flop of said shift register and an output signal from said first inverter;
- a second inverter for inverting an output signal from said first NAND gate and outputting a first mat switch control signal;
- third and fourth inverters for sequentially inverting the data output from the first flip-flop of said shift register and outputting a second mat switch control signal;
- a second NAND gate for logically combining the output signal from said first inverter and the data output from the first flip-flop of said shift register;
- a third NAND gate for logically combining the least significant bit of the mat selection addresses and the data output from the first flip-flop of said shift register;
- a fourth NAND gate for logically combining output signals respectively from said second and third NAND gates and outputting a third mat switch control signal;
- fifth and sixth inverters for sequentially inverting data output from a second flip-flop of said shift register and outputting a fourth mat switch control signal;
- a fifth NAND gate for logically combining the output signal from said first inverter and data output from a third flip-flop of said shift register;
- a sixth NAND gate for logically combining the least significant bit of the mat selection addresses and the data output from the second flip-flop of said shift register;
- a seventh NAND gate for logically combining output signals respectively from said fifth and sixth NAND gates and outputting a fifth mat switch control signal;
- seventh and eighth inverters for sequentially inverting the data output from the third flip-flop of said shift register and outputting a sixth mat switch control signal;
- an eighth NAND gate for logically combining the output signal from said first inverter and data output from a fourth flip-flop of said shift register;
- a ninth NAND gate for logically combining the data output from the third flip-flop of said shift register and the least significant bit of the mat selection addresses;
- a tenth NAND gate for logically combining output signals respectively from said eighth and ninth NAND gates and outputting a seventh mat switch control signal;
- ninth and tenth inverters for sequentially inverting the data output from the fourth flip-flop of said shift register and outputting an eighth mat switch control signal;
- an eleventh NAND gate for logically combining the least significant bit of the mat selection addresses and the data output from the fourth flip-flop of said shift register; and
- an eleventh inverter for inverting an output signal from said eleventh NAND gate and outputting a ninth mat switch control signal.

8. The circuit of claim 1, wherein said latch circuit comprises:
- a first inverter and a first delay circuit for receiving output signals from a plurality of delay circuits of a shift register in said mat switch controlling circuit;
- a first NAND gate for logically combining signals respectively supplied from said first inverter and said first delay circuit;
- a second inverter for inverting an output signal from said first NAND gate;
- first through fourth transistors serially coupled between first and second prescribed voltages, wherein the first transistor and the fourth transistor have a gate coupled for receiving an amplified output of the plurality of main amps, wherein the second transistor and the third transistor have gates receiving the output signal from said first NAND gate and an inverted signal thereof, respectively; and
- third and fourth inverters for sequentially inverting and latching an output signal from a common drain of said second transistor and said third transistor.

9. The circuit of claim 1, wherein said mat controlling circuit comprises:
- first, second, and third inverters for inverting first, second, and third address signals, respectively;
- a first NAND gate for logically combining the first address signal and a test mode enable signal;
- a fourth inverter for inverting the test mode enable signal;
- a second NAND gate for logically combining an output signal from said first inverter and the test mode enable signal;

a third NAND gate for logically combining output signals from said first, second, and third inverters;

a fourth NAND gate for logically combining the output signals from said second and third inverters and the first address signal;

a fifth NAND gate for logically combining the output signals from said first and third inverters and the second address signal;

a sixth NAND gate for logically combining the output signals from said third inverter and the first and second address signals;

a seventh NAND gate for logically combining the output signals from said first and second inverters and the third address signal;

an eighth NAND gate for logically combining the first and third address signals and the output signal from said second inverter;

a ninth NAND gate for logically combining the second and third address signals and the output signal from said first inverter;

a tenth NAND gate for logically combining the first, second, and third address signals;

eleventh, twelfth, thirteenth, fourteenth, fifteenth, sixteenth, seventeenth, and eighteenth NAND gates for logically combining output signals from said third, fourth, fifth, sixth, seventh, eighth, ninth, and tenth NAND gates, respectively, with an output signal from said fourth inverter;

nineteenth, twenty-first, twenty-third, and twenty-fifth NAND gates for logically combining output signals from said eleventh, thirteenth, fifteenth, and seventeenth NAND gates, respectively, with an output signal from said first NAND gate;

twentieth, twenty-second, twenty-fourth, and twenty-sixth NAND gates for logically combining output signals from said twelfth, fourteenth, sixteenth, and eighteenth NAND gates, respectively, with an output signal from second NAND gate; and fifth, sixth, seventh, eighth, ninth, tenth, eleventh, and twelfth inverters for inverting output signals from said nineteenth, twentieth, twenty-first, twenty-second, twenty-third, twenty-fourth, twenty-fifth, and twenty-sixth NAND gates, respectively, and outputting first, second, third, fourth, fifth, sixth, seventh, and eighth mat control signals, respectively.

10. The circuit of claim 1, wherein said latch circuit latches the data amplified by the plurality of main amps to be simultaneously supplied to a comparing circuit.

11. The circuit of claim 1, wherein said mat switch controlling circuit controls the plurality of mat switches so that the plurality of mats are divided into even and odd-numbered units to operate in a test mode.

12. The circuit of claim 1, further comprising a comparing unit that compares outputs from the main amps, wherein each of said mats comprises a 256K cell array of having a matrix form of rows and columns, a wordline driving circuit for driving wordlines and a sense amp.

13. A memory test circuit, comprising:

a plurality of mats coupled to input/output lines; and a mat controller coupled to each of the plurality of mats and responsive to a first address signal and a test mode enable signal received by the mat controller, wherein said mat controller divides the plurality of mats into even and odd-numbered mats, simultaneously enables one of the even and odd-numbered mats, and sequentially couples each of the plurality of mats with the corresponding input/output lines.

14. The circuit of claim 13, wherein said mat controller comprises;

a mat control circuit to control the plurality of mats to be respectively activated according to each of a plurality of modes; and a mat switch control circuit, wherein said mat control circuit divides and activates the plurality of mats into even and odd-numbered mats, and said mat switch control circuit sequentially couples each of the plurality of mats with the plurality of input/output lines to transfer data in and out of the mats.

15. The circuit of claim 14, further comprising:

a plurality of local input/output lines coupled to each of the plurality of mats;

a plurality of global input/output lines coupled to each of the plurality of main amplifiers; and a plurality of mat switches, wherein said plurality of mat switches selectively connect said plurality of local input/output lines with said plurality of global input/output lines.

16. The circuit of claim 15, wherein said mat control circuit is responsive to a plurality of address signals and the test mode enable signal, and said mat switch control circuit is responsive to an internal pulse and one of a clock signal and an internal control signal, and wherein said plurality of mat switches are responsive to an output from said mat control circuit, an output from said mat switch control circuit, and the test mode enable signal.

17. The circuit of claim 16, further comprising:

a plurality of amplifiers; and a main amplifier control circuit, wherein said plurality of amplifiers is coupled to receive data from said global input/output lines, and said main amplifier control circuit selectively enables each of said plurality of amplifiers to allow the selected amplifier to output amplified data.

18. The circuit of claim 17, further comprising a data latch coupled to said plurality of amplifiers; and a comparing unit coupled to receive the output of said data latch, wherein said data latch latches the amplified data outputted by said each of the plurality of amplifiers to be outputted substantially concurrently.

19. The circuit of claim 13, further comprising:

a main amplifier controller to select one of a plurality of main amplifiers; and a data latch to latch data amplified by each of the plurality of main amplifiers, wherein said plurality of main amplifiers are coupled to the input/output lines.

* * * * *